(12) United States Patent
Chan et al.

(10) Patent No.: US 11,056,376 B2
(45) Date of Patent: Jul. 6, 2021

(54) REMOVING AN ORGANIC SACRIFICIAL MATERIAL FROM A TWO-DIMENSIONAL MATERIAL

(71) Applicant: IMEC VZW, Leuven (BE)

(72) Inventors: Boon Teik Chan, Wilsele (BE); Jean-Francois de Marneffe, Bossut-Gottechain (BE); Daniil Marinov, Saint Petersburg (RU); Han Chung Lin, Heverlee (BE); Inge Asselberghs, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/674,953

(22) Filed: Nov. 5, 2019

(65) Prior Publication Data

US 2020/0144094 A1    May 7, 2020

(30) Foreign Application Priority Data

Nov. 5, 2018  (EP) ..................... 18204338

(51) Int. Cl.
| | |
|---|---|
| *H01L 21/683* | (2006.01) |
| *H01L 21/02* | (2006.01) |
| *H01L 21/78* | (2006.01) |
| *H01L 29/24* | (2006.01) |
| *H01L 29/786* | (2006.01) |

(52) U.S. Cl.
CPC .... *H01L 21/6836* (2013.01); *H01L 21/02568* (2013.01); *H01L 21/7806* (2013.01); *H01L 29/24* (2013.01); *H01L 29/78696* (2013.01); H01L 2221/68363 (2013.01)

(58) Field of Classification Search
CPC .......... H01L 21/6836; H01L 21/02568; H01L 21/7806; H01L 29/24; H01L 29/78696; H01L 2221/68363; H01L 21/31138; H01L 21/02002; H01L 21/02227
USPC .......................................... 257/29
See application file for complete search history.

(56) References Cited

U.S. PATENT DOCUMENTS

| | | | | |
|---|---|---|---|---|
| 8,900,467 | B1 * | 12/2014 | Chapuis | C08J 7/02 216/41 |
| 9,105,854 | B2 * | 8/2015 | Fogel | H01L 51/0013 |
| 9,416,447 | B2 * | 8/2016 | Arora | C23C 16/402 |
| 2012/0146421 | A1 | 6/2012 | Umayahara | |
| 2015/0255298 | A1 | 9/2015 | Darling et al. | |
| 2018/0269059 | A1 | 9/2018 | Lin et al. | |

OTHER PUBLICATIONS

European Search Report, European Patent Application No. 18204338. 0, dated Apr. 15, 2019, 9 pages.
(Continued)

*Primary Examiner* — Vu A Vu
(74) *Attorney, Agent, or Firm* — McDonnell Boehnen Hulbert & Berghoff LLP

(57) ABSTRACT

In a first aspect, the present disclosure relates to a method for removing an organic sacrificial material from a 2D material, comprising: providing a target substrate having thereon the 2D material and a layer of the organic sacrificial material over the 2D material, infiltrating the organic sacrificial material with a metal or ceramic material, and removing the organic sacrificial material.

16 Claims, 4 Drawing Sheets

(56) References Cited

OTHER PUBLICATIONS

Hwang, Hyeon Jun et al., "Facile Process to Clean PMMA Residue on Graphene Using KrF Laser Annealing", AIP Advances, vol. 8, 2018, pp. 105326-1-105326-6.
Nam, Chang-Yong et al., "Direct Fabrication of High Aspect-Ratio Metal Oxide Nanopatterns Via Sequential Infiltration Synthesis in Lithographically Defined SU-8 Templates", J. Vac. Sci. Technol. B, vol. 33, No. 6, Nov./Dec. 2015, pp. 06F201-1-06F201-7.
McCreary, Kathleen M. et al., "The Effect of Preparation Conditions on Raman and Photoluminescence of Monolayer WS2", Scientific Reports, 6:35154 DOI: 10.1038/srep35154, pp. 1-10.
McCreary, Kathleen M. et al., "Substrate Sensitivity of Monolayer WS2", Naval Research Laboratory and Department of Physics, The Ohio State University, 2016, 29 pages.
Elam, Jeffrey W. et al., "New Insights into Sequential Infiltration Synthesis", ECS Trans., vol. 69, No. 7, 2015, 16 pages.

\* cited by examiner

REMOVING AN ORGANIC SACRIFICIAL MATERIAL FROM A TWO-DIMENSIONAL MATERIAL

CROSS-REFERENCE TO RELATED APPLICATIONS

The present application is a non-provisional patent application claiming priority to European Patent Number 18204338.0, filed Nov. 5, 2018, the contents of which are hereby incorporated by reference.

FIELD OF THE DISCLOSURE

The present disclosure relates to the provision of two-dimensional (2D) materials and in particular to the provision of 2D materials in semiconductor devices.

BACKGROUND

In view of seeking to uphold Moore's law and the associated continuous quest for scaling down, there is a growing interest in the field of semiconductor devices to make use of 2D materials such as graphene, transition metal dichalcogenides ($MX_2$), hexagonal boron nitride (h-BN), etc. by integrating them in these semiconductor devices.

One promising way to achieve this integration is to grow, for example, via chemical vapour deposition (CVD), the 2D material on a host substrate and then transfer the 2D material to a target substrate (e.g., a semiconductor substrate). An example of this approach was disclosed by McCreary et al. (2016) (MCCREARY, Kathleen M., et al. The effect of preparation conditions on Raman and photoluminescence of monolayer WS 2. Scientific reports, 2016, 6: 35154). Therein, after CVD growing a tungsten disulfide ($WS_2$) 2D layer on a silicon/silicon dioxide ($Si/SiO_2$) host substrate (therein referred to as a 'growth substrate'), a thin layer of polymethyl methacrylate (PMMA) was spun onto the surface of the entire growth substrate then submerged in buffered oxide etchant. After several hours, the oxide layer was removed, freeing the $WS_2$/PMMA film from the growth substrate. The sample was subsequently transferred to water ($H_2O$) to rinse chemical etchants, where a fresh $Si/SiO_2$ substrate is used to lift the film out of the water. A 2000 rotations per minute (rpm) spin and 150° C. bake improved the uniformity and adhesion to the substrate, after which the PMMA was dissolved in acetone.

However, in practice of these methods, the organic sacrificial material, for example, PMMA is only partially removed from the 2D material; a residue of the organic sacrificial material remains on the 2D material. As such, there is still a desire in the art for better methods to transfer a 2D material to a target substrate and subsequently remove the organic sacrificial material.

SUMMARY

The present disclosure provides methods for removing an organic sacrificial material from a 2D material. Further, the present disclosures provide structures associated with the method. This may be accomplished by a method and structure according to the present disclosure.

In embodiments of the present disclosure, the top surface of the 2D material may be completely uncovered (e.g., freed from any organic sacrificial material).

In embodiments of the present disclosure, the organic sacrificial material may be removed without damaging the 2D material.

In embodiments of the present disclosure, a metal or ceramic material may act as a protection and/or passivation layer for the 2D material.

In embodiments of the present disclosure, the method is compatible with a variety of 2D materials.

In embodiments of the present disclosure, the 2D materials can be used in various functions in practical devices (e.g., in semiconductor devices).

In embodiments of the present disclosure, the transfer of 2D materials is facilitated, thereby allowing them to be more easily integrated into different applications.

In embodiments of the present disclosure, the method is relatively straightforward in its execution and is economical.

In embodiments of the present disclosure, a dielectric layer may be formed on the 2D material by using the metal or ceramic material as a seed layer.

In embodiments of the present disclosure, a dielectric layer may be formed from the metal or ceramic material as such.

In embodiments of the present disclosure, a portion of the organic sacrificial material may be made to be irreversibly physically adsorbed to the 2D material.

In embodiments of the present disclosure, the method is compatible with a variety of substrates, including structured substrates.

In embodiments of the present disclosure, a conformal 2D material, a conformal organic sacrificial material (e.g., the irreversibly physically adsorbed portion thereof) and/or a conformal dielectric layer can be provided, even on a structured substrate.

In a first aspect, the present disclosure relates to a method for removing an organic sacrificial material from a 2D material, comprising: providing a target substrate having thereon the 2D material and a layer of the organic sacrificial material over the 2D material, infiltrating the organic sacrificial material with a metal or ceramic material, and removing the organic sacrificial material.

In a second aspect, the present disclosure relates to a structure, comprising: (i) a target substrate, (ii) a 2D material over the target substrate, and (iii) a layer over the 2D material, the layer comprising an organic sacrificial material, the organic sacrificial material comprising a metal or ceramic material.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and aspects of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
FIG. 1 schematically shows a vertical cross-section of structures, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, over, under, and the like in the description and the claims are used for descriptive purposes and not necessarily for describing relative positions. It is to be understood that the terms so used are interchangeable with their antonyms under certain circumstances and that the embodiments of the disclosure described herein are capable of operation in other orientations than described or illustrated herein.

It is to be noticed that the term "comprising", used in the claims, should not be interpreted as being restricted to the embodiments listed thereafter; it does not exclude other elements or steps. It is thus to be interpreted as specifying the presence of the stated features, integers, steps or components as referred to, but does not preclude the presence or addition of one or more other features, integers, steps, or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

Reference will be made to transistors. These are devices having a first main electrode such as a drain, a second main electrode such as a source, and a control electrode such as a gate for controlling the flow of electrical charges between the first and second main electrodes.

The following term is provided solely to aid in the understanding of the disclosure.

As used herein, and unless otherwise specified, a 2D material is a crystalline material consisting of a single atomically thin layer of covalently bonded atoms or consisting of several (e.g., 2 or 3) such layers held together by van der Waals forces. Self-assembled monolayers (SAMs) are not 2D materials in the sense of the present disclosure since they are not crystalline and they are not consisting of an atomically thin layer but are consisting of a thicker layer which thickness is the length of the molecule self-assembling in the SAM. In some embodiments, 2D materials in the sense of the present disclosure are mineral materials.

As used herein the term "metal or ceramic material precursor" relates to a precursor in the formation of a metal or of a ceramic material. In the present disclosure, types of "metal or ceramic material precursor" may be precursors to metal oxides or to metalloid oxides.

In a first aspect, the present disclosure relates to a method for removing an organic sacrificial material from a 2D material, comprising: (a) providing a target substrate having thereon the 2D material and a layer of the organic sacrificial material over the 2D material, (b) infiltrating the organic sacrificial material with a metal or ceramic material, and (c) removing the organic sacrificial material.

Although the target substrate may be of any nature, in some example embodiments, the target substrate is a semiconductor substrate. In embodiments, the semiconductor substrate may be a silicon (Si) substrate, a germanium (Ge) substrate, a semiconductor-on-insulator substrate (SOI; for example Si-on-insulator or Ge-on-insulator) or a III-V substrate. In embodiments, the target substrate may be a structured substrate.

As used herein, and unless provided otherwise, a structured substrate (or a patterned substrate) is a substrate having a top surface comprising valleys and peaks, as opposed to having a planar top surface. For instance, the valleys may be at least 1 nm deep and the peaks may be at least one nm high. As another example, the valleys may be at least 10 nanometers (nm) deep and the peaks may be at least 10 nm high. These are merely examples and the present disclosure is compatible with any substrate top surface morphology. In embodiments, the 2D material may be a 2D conductor, a 2D semiconductor, or a 2D dielectric. In embodiments, the 2D material may be for use in a semiconductor device (e.g., a transistor). In embodiments, the 2D material may be forming a channel layer, a source electrode, a drain electrode, a gate dielectric, or a gate electrode.

The present disclosure is applicable to any type of 2D material since the steps of the method are performed on the overlying organic sacrificial material and since the 2D material is protected by the method. In embodiments, the 2D material may be selected from X-enes (2D materials made of a single element, for example graphene, germanene, silicene, phosphorene, borophene, stanine, bismuthene), transition metal dichalcogenides (also called TMDs, they are of the form $MX_2$ where M is a transition metal and X is a chalcogen, for example $MoS_2$, $WS_2$), semimetal chalcogenides (also called SMCs, they are of the form $M_2X_2$ where M is a semimetal (e.g., Ga or In) and X is a chalcogen (e.g., S or Se), MX-enes (2D materials of the form $M_{n+1}X_n$ wherein n is 1, 2, or 3, where M is one or more transition metals, and X is carbon or nitrogen, for example transition metal carbide, nitride or carbonitride, such as $Ti_2C$, $(Ti_{0.5}, Nb_{0.5})_2C$, $V_2C$, $Nb_2C$, $Mo_2C$, $Ti_3C_2$, $Ti_3CN$, $Zr_3C_2$, $Hf_3C_2$, $Mo_2TiC_2$, and $Cr_2TiC_2$), hexagonal boron nitride (h-BN), graphene oxide, $Si_2BN$, borocarbonitrides, and germanane, amongst others.

The present disclosure may be useful when applied to transition metal dichalcogenides (TMDs) which are a promising class of materials to form transistor channels and for which damages to the 2D material, or the presence of organic residues, after removal of a sacrificial organic material have been reported.

In some embodiments, the 2D material may be conformal with the target substrate thereunder. For example, the target substrate may be a structured substrate and the 2D material may follow valleys and peaks thereof.

In embodiments, the organic sacrificial material may be a polymer. In embodiments, the polymer may comprise functional groups suitable for coordinating with the first precursor (cf. infra). In embodiments, the polymer may be an electron donor, or may comprise an electron donor group, for coordinating with a Lewis acid. In embodiments, the polymer may comprise one or more heteroatoms (e.g., oxygen or nitrogen), such as in a carbonyl, ester, amide or amine functionality. In embodiments, the polymer may be poly(methyl methacrylate) (PMMA), polyphthalaldehyde, or polyphthalamide.

In embodiments, the organic sacrificial material may be conformal with the 2D material thereunder.

In embodiments, the metal material may be W. In embodiments, the ceramic material may be a metal oxide or metalloid oxide, such as $Al_2O_3$, ZnO, $TiO_2$, $SiO_2$ or $HfO_2$.

In embodiments, step (a) may comprise: (a1) providing a host substrate having thereon the 2D material, (a2) covering the 2D material with a layer of organic sacrificial material, and (a3) transferring the 2D material and the layer of organic sacrificial material onto the target substrate (in such a way that the 2D material comes in mechanical contact with the target substrate). In embodiments, the host substrate may be a sapphire substrate, a Si substrate or a SOI (e.g., Si on $SiO_2$) substrate. In embodiments, step (a2) may comprise spin coating the organic sacrificial material over the 2D material. In embodiments, step (a3) may comprise bonding a thermal tape to the layer of organic sacrificial material and transferring the stack of the 2D material, the layer of organic sacrificial material and the thermal tape onto the target substrate (in such a way that the 2D material comes in mechanical contact with the target substrate).

In embodiments, at least a lower portion of the organic sacrificial material in step (a) (e.g., in step (a2)) may be irreversibly physically adsorbed to the 2D material. By irreversibly physically adsorbed, it is meant that the portion cannot be removed by any solvent. For instance, it survives contact with benzene for 3 hours.

In embodiments, the lower portion may have a thickness of from 1 to 10 nm. More specifically, in some examples from 1 to 4 nm. In embodiments, the lower portion of the layer of organic sacrificial material irreversibly physically adsorbed to the 2D material may be formed by a step of baking the layer of organic sacrificial material at a temperature above its glass transition temperature $T_g$ (but low enough to avoid calcination). In embodiments, the step of baking the layer of organic sacrificial material may be performed for between 6 and 24 hours. More specifically in some examples, between 12 and 24 hours. The baking step is followed by a step of removing non-irreversibly physically adsorbed organic sacrificial material. This can be performed by exposing the organic sacrificial material to a solvent for at least 30 minutes. In some examples, the organic sacrificial material may be exposed between 1 hour and 3 hours. In some example embodiments, a solvent is capable of dissolving the organic sacrificial material in bulk form. For instance, if the organic sacrificial material is PMMA, solvents may be benzene, toluene, and xylene amongst others.

In embodiments, forming an irreversibly physically adsorbed organic sacrificial material on a 2D material on a structured substrate may comprise 1) providing the structured substrate, 2) providing the 2D material conformally on the structured substrate, 3) providing an organic sacrificial material in such a way that it planarizes the valleys and peaks of the structured substrate, so as to obtain a layer of organic sacrificial material having a planar top surface, 4) baking the layer of organic sacrificial material at a temperature above its glass transition temperature $T_g$ (but low enough to avoid calcination), and 5) removing non-irreversibly physically adsorbed organic sacrificial material. In some examples, step 5) removes any non-irreversibly physically adsorbed organic sacrificial material. Step 5) may typically be performed by exposing the organic sacrificial material to a solvent as explained above.

In embodiments, step (b) may comprise a sequential infiltration synthesis (SIS). SIS may be performed at a temperature of from 10° C. to 110° C., for example, from 20° C. to 90° C. In embodiments, step (b) may comprise: (b1) exposing the organic sacrificial material to a first precursor, and (b2) exposing the organic sacrificial material to a second precursor.

Steps (b1) and (b2) results in the infiltration of the organic sacrificial material with a metal or ceramic material. It may comprise exposing the organic sacrificial material to a first metal or ceramic material precursor, thereby typically absorbing the first metal or ceramic material precursor in the organic sacrificial material, and subsequently exposing the organic sacrificial material to a second metal or ceramic material precursor, thereby typically chemically reacting both precursors to form the metal or ceramic material. The first and second metal or ceramic material precursors are typically reagents in the formation of the metal or ceramic material and are not typically metals or ceramic materials themselves. In some embodiments, the first and/or second metal or ceramic material precursors may be in a gaseous phase. In yet more embodiments, both the first and second metal or ceramic material precursors may be in a gaseous phase.

In general, for the first precursor, any CVD or atomic layer deposition (ALD) precursors of metal or ceramic material which can infiltrate the organic sacrificial material may be used. In some embodiments, the first precursor reacts with the second precursor at a temperature from 10° C. to 110° C., for example, from 20° C. to 90° C. Typically, the first precursor is able to infiltrate the organic sacrificial material. The infiltrated metal or ceramic material may be obtained through a reduction (typically for the metal) or oxidation (typically for the ceramic) of the first metal or ceramic material precursor by way of the second metal or ceramic material precursor (here typically a reductant or oxidant). In embodiments, the first precursor may be a Lewis acidic metal or metalloid compound. In embodiments, the Lewis acidic metal or metalloid compound may be selected from $Al(CH_3)_3$ (trimethylaluminum, TMA), $Zn(C_2H_5)_2$, $TiCl_4$, $SiCl_4$, $HfCl_4$, and $WF_6$. In embodiments, the second precursor may be a reductant (e.g., for the first precursor) or an oxidant (e.g., for the first precursor). In embodiments, the reductant may be $SiH_4$, $SiH_2$, or $H_2$. In embodiments, the oxidant may be $H_2O$ or $O_3$. In embodiments, to infiltrate a metal in the organic sacrificial material, the first precursor may be $WF_6$ and the second precursor may be a reductant (e.g., $SiH_4$, $SiH_2$, or $H_2$). In embodiments, to infiltrate a ceramic material in the organic sacrificial material, the first precursor may be a Lewis acidic metal or metalloid selected from $Al(CH_3)_3$, $Zn(C_2H_5)_2$, $TiCl_4$, $SiCl_4$, $HfCl_4$, and the second precursor may be an oxidant (e.g., $H_2O$ or $O_3$). In embodiments, step (b) may be performed in a reaction chamber. In some embodiments, step (b1) may further comprise, after exposing the organic sacrificial material to the first precursor, purging the reaction chamber with an inert gas (e.g., $N_2$). In some embodiments, step (b2) may further comprise, after exposing the organic sacrificial material to the second precursor, purging the reaction chamber with an inert gas (e.g., $N_2$).

In embodiments, a sequence comprising step (b1) and step (b2) may be performed from 1 to 100 times, for examples, from 2 to 20 times or from 3 to 10 times.

The result of step (b) is a metal or ceramic material-infiltrated organic sacrificial material. This resulting material typically comprises an organic part in which a ceramic or metallic material is embedded. Most typically, chains of the organic sacrificial material are ruptured during the infiltration process, leading to the formation of a mixture of 1) organic units, smaller than the original organic sacrificial material, and 2) ceramic or metal material. The result of step (b) can also typically be seen as a ceramic or metal material matrix in which organic units, smaller than the original organic sacrificial material, are dispersed.

In embodiments, step (c) may comprise a thermal treatment, a plasma treatment, or a combination thereof. These treatments may be performed in an inert atmosphere. In embodiments, the thermal treatment and/or the plasma treatment may be combined with a UV treatment. This is desired as it permits a faster treatment, at a lower temperature, and with less risk of damage to the 2D material. In embodiments, the thermal treatment may comprise heating the organic sacrificial material to a temperature sufficient to achieve thermal decomposition of the organic sacrificial material (in the given conditions, for example in presence of a UV and/or plasma treatment, or in absence of both UV and plasma treatment, for example). Typically, a temperature of 400° C. or more, or of 500° C. or more is sufficient for most organic sacrificial materials. In the case of the organic sacrificial material being PMMA, a temperature of 400° C. or above can for instance be used. When a combination of a thermal treatment and a UV treatment is used, lower decomposition temperatures can be achieved. For instance, a temperature in the range 300-400° C. may suffice. In embodiments, the plasma treatment may be an indirect plasma treatment such as a downstream or remote plasma treatment (a plasma processing method in which the interaction between the plasma and the material occurs at a location remote from the plasma in the plasma afterglow). This is desired as it is less prone to damage the 2D material. The plasma treatment may, for instance, comprise an $H_2$ (remote) or $H_2/N_2$ plasma treatment.

When a plasma treatment is used, it may be used together with a UV treatment. When a plasma treatment is used, it is an indirect plasma treatment (e.g., a downstream plasma treatment such as an $H_2$ downstream plasma treatment). Additionally, when a plasma treatment is used, it is used simultaneously with a thermal treatment at at least 250° C., for instance in the range 250-350° C., and with a UV treatment. Such a combination of indirect plasma, UV, and heat are very fast and has a low tendency to damage the 2D material.

Although a faster treatment is generally desired, it is typically more difficult to control than slower treatments. Slower treatments are therefore also sometimes used.

In embodiments, the UV treatment may comprise exposing the organic sacrificial material to ultraviolet (UV) light having a wavelength between 100 and 300 nm.

The organic sacrificial material may be removed in step (c), without removing or damaging the 2D material and the metal or ceramic material. In this respect, in embodiments, the metal or ceramic material may act as a protection or passivation layer for the 2D material.

In embodiments, the method may further comprise a step (a'), after step (a) and before step (b), of partially removing the organic sacrificial material. In embodiments, partially removing the organic sacrificial material may comprise leaving a residue of the organic sacrificial material on the 2D material. In embodiments, partially removing the organic sacrificial material may comprise leaving an irreversibly physically adsorbed portion of the organic sacrificial material on the 2D material. In embodiments, step (a') may comprise a wet cleaning. In embodiments, the wet cleaning may comprise the use of a solvent suitable for solubilizing the organic sacrificial material. For instance, the solvent may be selected from acetone, acetic acid, toluene, anisole or benzene. These solvents are for instance suitable for solubilizing PMMA. In embodiments, the wet cleaning may comprise dipping the organic sacrificial material in a solvent for at least 1 hour, for instance from 1 to 3 hours. In embodiments, step (a') may comprise a plasma treatment. In embodiments, the plasma treatment may comprise an $H_2$ plasma treatment (e.g., $H_2$ remote plasma) or an $H_2/N_2$ plasma treatment.

In embodiments, step (c) may further comprise removing the metal or ceramic material. In embodiments, removing the metal or ceramic material may comprise a wet etching, for example using tetramethylammonium hydroxide (TMAH) or an ammonia-peroxide mixture (APM). TMAH and APM are for instance suitable to remove $Al_2O_3$. In some embodiments, removing the metal or ceramic material may be performed selectively with respect to the 2D material. The metal or ceramic material may be removed so as to uncover the 2D material without damaging it or leaving any residue thereon. Indeed, it is easier to remove the metal or ceramic material without damaging the underlying 2D material than removing a sacrificial organic material, in absence of infiltrated metal or ceramic material, without damaging the 2D material.

In embodiments, step (c) comprises removing simultaneously both the metal or ceramic material and the organic sacrificial material infiltrated therewith by a wet etching as described supra.

In embodiments, when the metal or ceramic material is a ceramic material and is not removed in step (c), the method may further comprise a step (d), after step (c), of forming, using the ceramic material as a seed layer, a dielectric layer over the ceramic material. In embodiments, after removing the organic sacrificial material in step(c), a layer of the ceramic material over the 2D material may be obtained, the layer being a dielectric layer. In embodiments, the dielectric layer may be a high dielectric constant (i.e., high-k dielectric layer). In embodiments, the dielectric layer may be for use in a semiconductor device (e.g., a transistor). In embodiments, the dielectric layer may be for forming a gate dielectric. In embodiments, the dielectric layer may be conformal with the 2D material thereunder. The ceramic material may be used, either as such or by using it as a seed layer, to form a (conformal) dielectric layer over the 2D material.

In a second aspect, the present disclosure relates to a structure, comprising: (i) a target substrate, (ii) a 2D material on the target substrate, and (iii) a layer over (and typically on) the 2D material, the layer comprising an organic sacrificial material, the organic sacrificial material comprising a metal or ceramic material.

In embodiments, the layer over the 2D material may comprise an organic sacrificial material infiltrated by a metal or ceramic material. In embodiments, the layer over the 2D material may comprise a metal-infiltrated or a ceramic-material-infiltrated organic sacrificial material.

In embodiments, any feature of any embodiment of the second aspect may independently be as correspondingly described for any embodiment of the first aspect.

The disclosure will now be described by a detailed description of several embodiments of the disclosure. Other embodiments of the disclosure can be configured according to the knowledge of the person skilled in the art without departing from the true technical teaching of the disclosure, the disclosure being limited only by the terms of the appended claims.

Example 1: Removing an Organic Sacrificial Material from a 2D Material

We now refer to FIG. 1. A layer of 2D material (200; for example an $MX_2$ material such as an $MoS_2$ or a $WS_2$ material) was grown on a host substrate (110).

Figure 2:
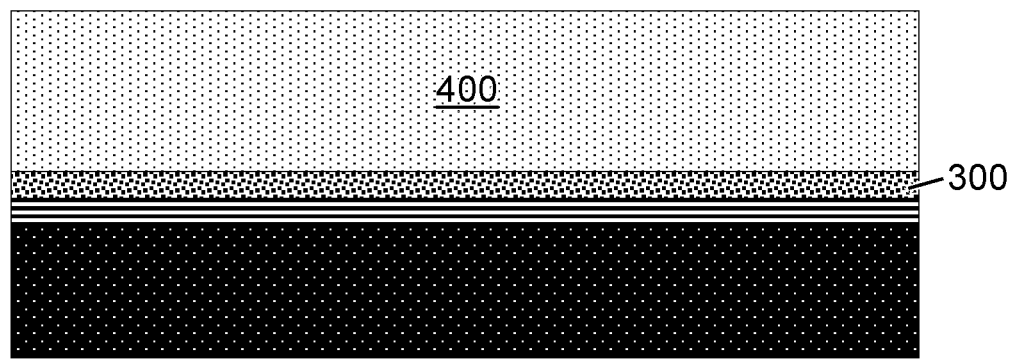
FIG. 2 schematically shows a vertical cross-section of structures, according to an example embodiment.

We now refer to FIG. 2. A layer of organic sacrificial material (300; for example poly(methyl methacrylate), PMMA) was laminated on the 2D material (200). A thermal tape (400) was subsequently bonded to the organic sacrificial material (300).

Figure 3:
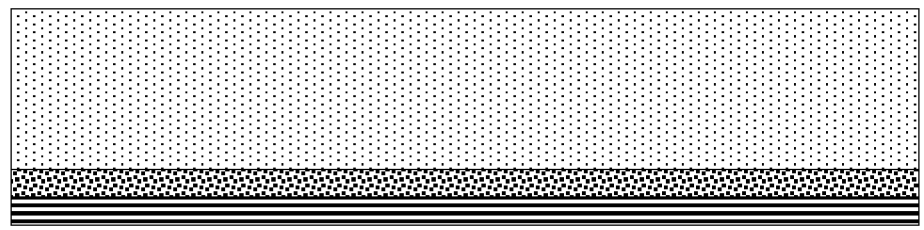
FIG. 3 schematically shows a vertical cross-section of structures, according to an example embodiment.

We now refer to FIG. 3. The stack of 2D material (200), organic sacrificial material (300) and thermal tape (400) was detached from the host substrate (110).

Figure 4:
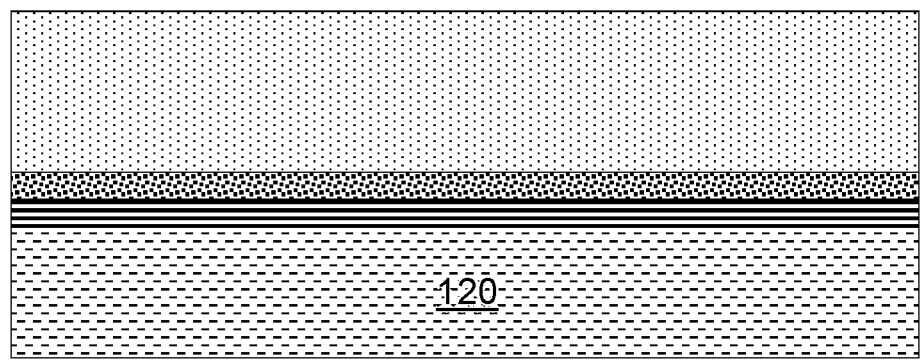
FIG. 4 schematically shows a vertical cross-section of structures, according to an example embodiment.

We now refer to FIG. 4. The stack of 2D material (200), organic sacrificial material (300) and thermal tape (400) was transferred to the target substrate (120).

Figure 5:
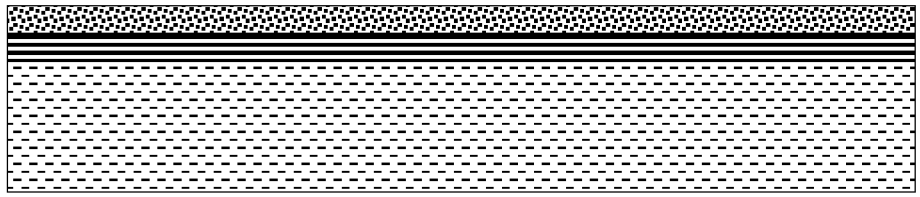
FIG. 5 schematically shows a vertical cross-section of structures, according to an example embodiment.

We now refer to FIG. 5. The thermal tape (400) was removed from the organic sacrificial material (300).

Figure 6:
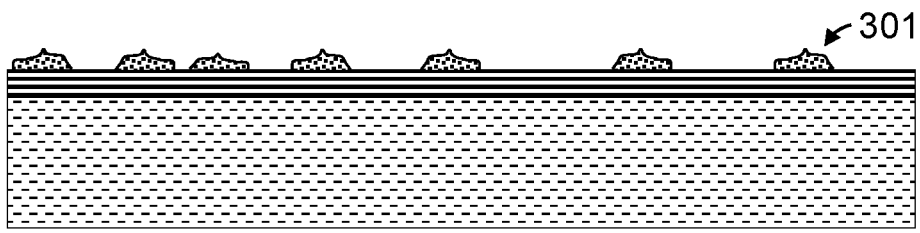
FIG. 6 schematically shows a vertical cross-section of structures, according to an example embodiment.

We now refer to FIG. 6. Using a wet treatment (e.g., with acetone) or a plasma treatment (e.g., with $H_2$ (remote) or $H_2/N_2$), the organic sacrificial material (300) was partially removed from the 2D material (200). However, some residue (301) of the organic sacrificial material remained on the 2D material (200).

Figure 7:
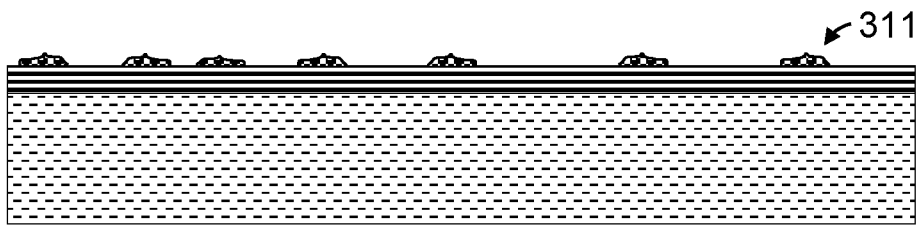
FIG. 7 schematically shows vertical cross-sections of structures, according to an example embodiment.

We now refer to FIG. 7. Using sequential infiltration synthesis (SIS), the residue (301) of the organic sacrificial material is infiltrated with a metal oxide material (311) (e.g., $Al_2O_3$). The metal oxide material infiltrates the residue without sticking to the surface of the 2D material. In the case of $MX_2$ being $MoS_2$ or $WoS_2$, without being bound to theory, we believe that this is achieved due to the hydrophobic nature of the S-terminated surface of $MoS_2$ and $WoS_2$.

Figure 8:
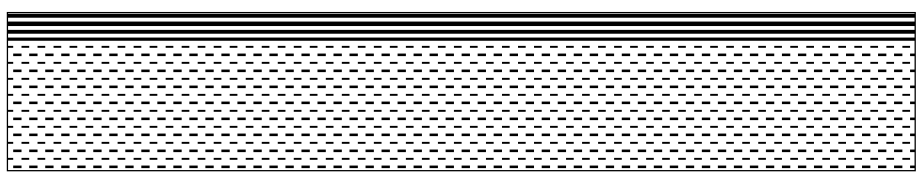
FIG. 8 schematically shows a vertical cross-section of structures, according to an example embodiment.

We now refer to FIG. 8. The remaining organic sacrificial material residue (310) is removed together with the metal oxide material (311) (in other words, the now metal-oxide material-infiltrated organic sacrificial material residue is removed), for example during the wet TMAH treatment. This typically does not involve a prior thermal and/or plasma treatment (optionally plus a UV treatment). However, such a prior treatment can be performed.

Example 2: Forming a Dielectric Layer Using the Metal or Ceramic Material as a Seed Layer Example 1 is repeated up to and including FIG. 7.

Figure 9:
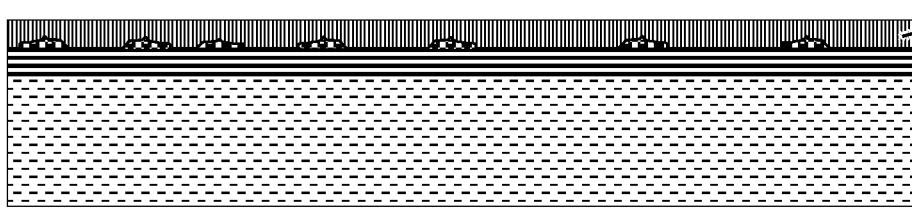
FIG. 9 schematically shows a vertical cross-section of structures, according to an example embodiment.

We now refer to FIG. 9. The remaining organic sacrificial material residue (310) is removed from the metal oxide material (311), by using a thermal treatment and/or a plasma treatment (optionally in combination with a UV treatment). During these treatments, the metal oxide material (311) may act as a protection/passivation layer for the underlying 2D material (200). Subsequently, using the metal oxide material (311) as a seed layer, a dielectric layer (510; e.g., a high-k material) is deposited over the 2D material (200) using atomic layer deposition (ALD).

Example 3: Forming a Dielectric Layer from the Metal or Ceramic Material

Example 1 was repeated up to and including FIG. 5.

Figure 10:
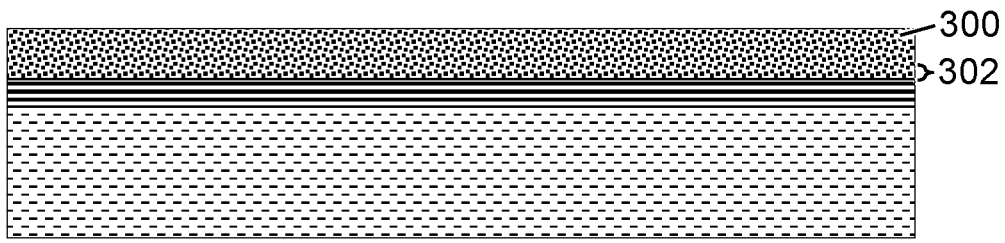
FIG. 10 schematically shows a vertical cross-section of structures, according to an example embodiment.

We now refer to FIG. 10. The organic sacrificial material (300) is baked in air for 12-14 hours at a temperature above its glass transition temperature $T_g$ but low enough to avoid calcination. This results in the formation of 1-4 nm thick bottom portion (302) of the organic sacrificial material (300) which is irreversibly adsorbed to the 2D material (200).

Figure 11:
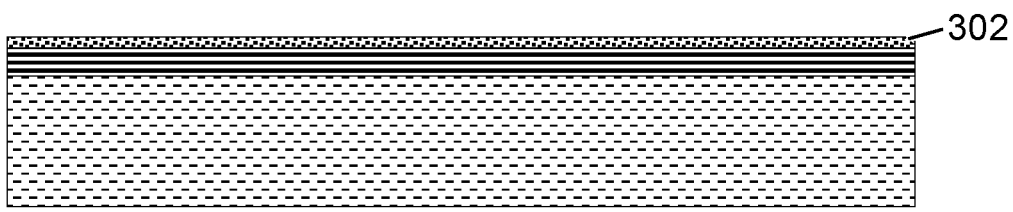
FIG. 11 schematically shows a vertical cross-section of structures, according to an example embodiment.

We now refer to FIG. 11. The organic sacrificial material (300) is dipped for 1-3 hours in a solvent (e.g., acetone, acetic acid, toluene, anisole, or benzene) to remove the organic sacrificial material which is not irreversibly adsorbed.

Figure 12:
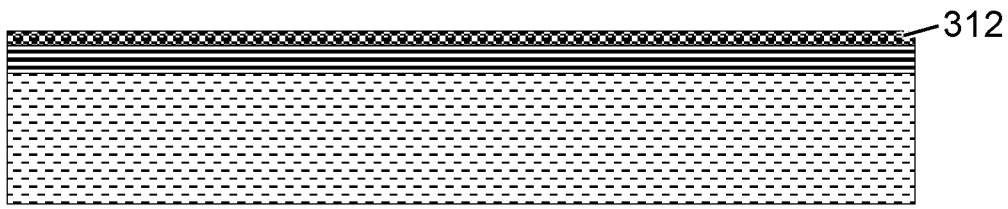
FIG. 12 schematically shows a vertical cross-section of structures, according to an example embodiment.

We now refer to FIG. 12. Using SIS, the irreversibly absorbed portion (302) of organic sacrificial material is infiltrated with a metal oxide dielectric material (312; for example $Al_2O_3$).

Figure 13:
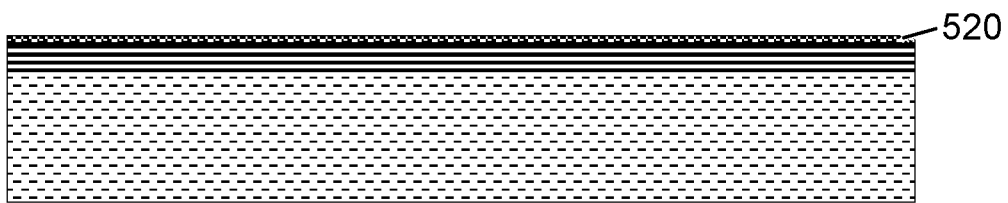
FIG. 13 schematically shows a vertical cross-section of structures, according to an example embodiment.

We now refer to FIG. 13. Using a thermal treatment and/or a plasma treatment (e.g., $H_2/N_2$) (optionally in combination with a UV treatment), the remaining organic sacrificial material (302) is removed from the metal oxide material (312). In this way, a dielectric layer (520; for example a high-k material) comprising the metal oxide material (312) is obtained over the 2D material (200).

Figure 14:
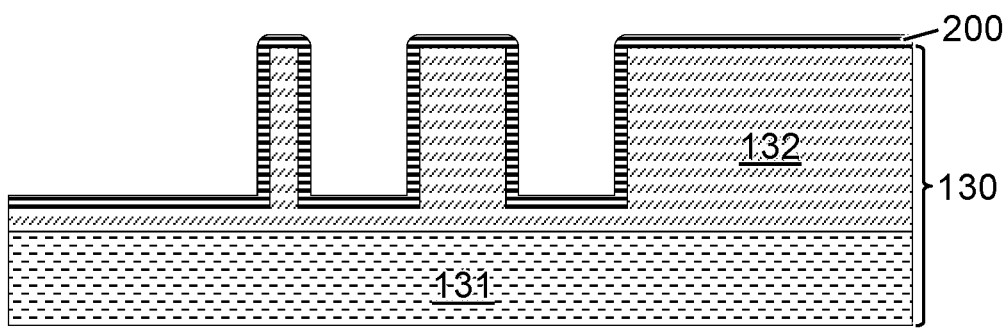
FIG. 14 schematically shows a vertical cross-section of structures, according to an example embodiment.

Example 4: Forming a Dielectric Layer from the Metal or Ceramic Material (312) Conformally on a Structured Substrate We now refer to FIG. 14. A conformal layer of 2D material (200; e.g., an $MX_2$ material) on a target substrate (130) is provided. The target substrate (130) comprises a 3D structured template layer (132) on a support layer (131).

Figure 15:
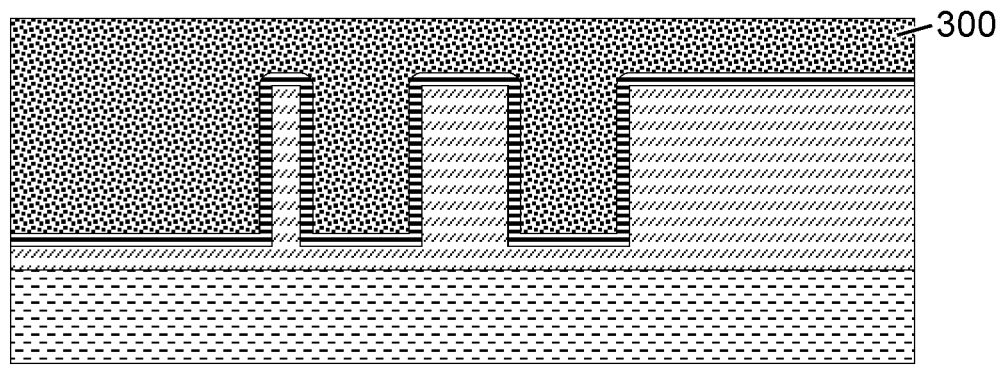
FIG. 15 schematically shows a vertical cross-section of structures, according to an example embodiment.

We now refer to FIG. 15. A layer of organic sacrificial material (300; e.g., poly(methyl methacrylate, PMMA) is spin-coated over the conformal 2D material (200), thereby forming a planarized layer which overfills the structuring of the template layer.

Figure 16:
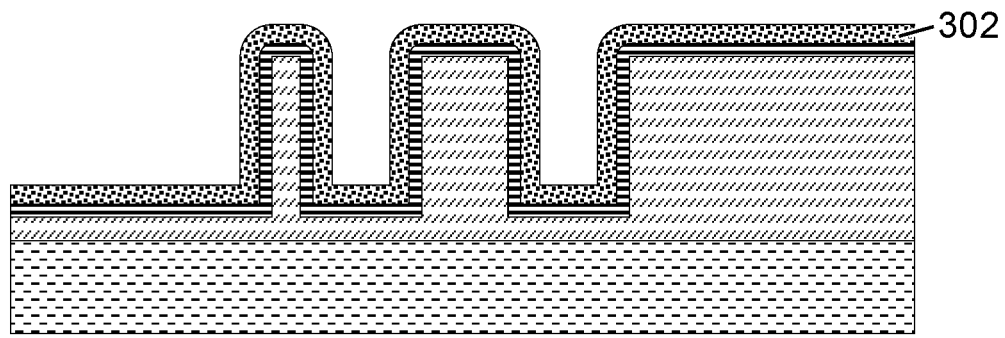
FIG. 16 schematically shows a vertical cross-section of structures, according to an example embodiment.

We now refer to FIG. 16. The organic sacrificial material (300) is baked in air for 12-14 hours at a temperature above its glass transition temperature $T_g$ but not so high as to trigger calcination. This results in the formation of 1-4 nm thick conformal bottom portion (302) of the organic sacrificial material (300) which is irreversibly adsorbed to the 2D material (200). Subsequently, the organic sacrificial material (300) is dipped for 1-3 hours in a solvent (e.g., acetone, acetic acid, toluene, anisole, or benzene) to remove the organic sacrificial material which is not irreversibly adsorbed.

Figure 17:
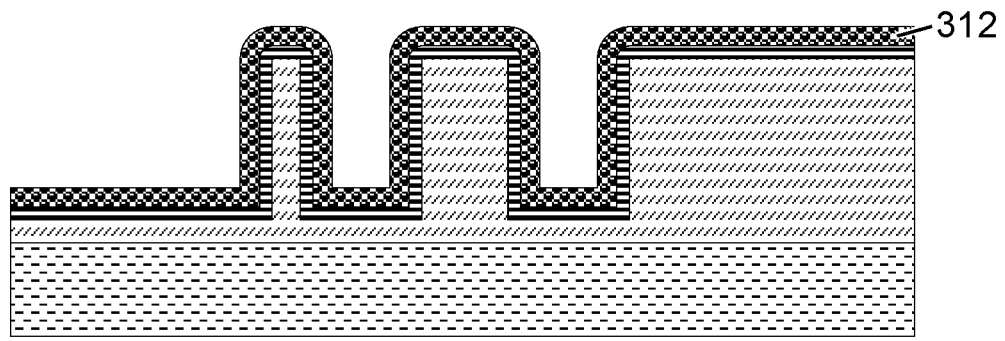
FIG. 17 schematically shows a vertical cross-section of structures, according to an example embodiment.

We now refer to FIG. 17. Using SIS, the portion of organic sacrificial material (302) is infiltrated with a metal oxide dielectric material (312; for example $Al_2O_3$). Subsequently, using a thermal treatment and/or a plasma treatment (e.g., $H_2/N_2$), eventually in combination with a UV treatment, the remaining organic sacrificial material (302) can be removed from the metal oxide material (312). In this way, a conformal dielectric layer (e.g., a high-k material) comprising the metal oxide material (312) is obtained over the 2D material (200).

It is to be understood that although some embodiments, specific constructions, and configurations, as well as materials, have been discussed herein for devices according to the present disclosure, various changes or modifications in form and detail may be made without departing from the scope and technical teachings of this disclosure. For example, any formulas given above are merely representative of procedures that may be used. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for removing an organic sacrificial material from a two-dimensional material, comprising:
    providing a target substrate having the two-dimensional material thereon and a layer of the organic sacrificial material over the two-dimensional material, wherein at least a portion of the organic sacrificial material is irreversibly physically adsorbed to the two-dimensional material;
    infiltrating the organic sacrificial material with a metal or ceramic material; and
    removing the organic sacrificial material.

2. The method according to claim 1, wherein the two-dimensional material is a two-dimensional conductor, a two-dimensional semiconductor or a two-dimensional dielectric.

3. The method according to claim 1, wherein the organic sacrificial material is a polymer.

4. The method according to claim 1, wherein infiltrating the organic sacrificial material with the metal or ceramic material comprises:
    exposing the organic sacrificial material to a first precursor; and
    exposing the organic sacrificial material to a second precursor.

5. The method according to claim 4, wherein the first precursor is a Lewis acidic metal compound and wherein the second precursor is a reductant or an oxidant.

6. The method according to claim 1, wherein infiltrating the organic sacrificial material with the metal or ceramic material comprises a sequential infiltration synthesis.

7. The method according to claim 1, wherein providing the target substrate having the two-dimensional material thereon and the layer of the organic sacrificial material over the two-dimensional material comprises:
   providing a host substrate having thereon the two-dimensional material;
   covering the two-dimensional material with a layer of organic sacrificial material; and
   transferring the two-dimensional material and the layer of organic sacrificial material onto the target substrate.

8. The method according to claim 1, wherein after providing the target substrate having the two-dimensional material thereon and the layer of the organic sacrificial material over the two-dimensional material and before infiltrating the organic sacrificial material with the metal or ceramic material, the method further comprises:
   partially removing the organic sacrificial material.

9. The method according to claim 1, wherein removing the organic sacrificial material comprises a thermal treatment or a plasma treatment or an ultra-violet treatment.

10. The method according to claim 1, wherein removing the organic sacrificial material further comprises removing the metal or ceramic material.

11. The method according to claim 1, further comprising:
   depositing, using the metal or ceramic material as a seed layer, a dielectric layer over the metal or ceramic material.

12. The method according to claim 1, wherein, after removing the organic sacrificial material, the method further comprises:
   forming a layer of the metal or ceramic material over the two-dimensional material, wherein the layer is a dielectric layer.

13. The method according to claim 1, wherein the target substrate is a structured substrate.

14. The method of claim 1, further comprising:
   removing a portion of the organic sacrificial material that is non-irreversibly physically adsorbed.

15. The method of claim 14, wherein removing the portion of the organic sacrificial material that is non-irreversibly physically adsorbed comprises exposing the organic sacrificial material to a solvent.

16. A structure, comprising:
   a target substrate;
   a two-dimensional material on the target substrate; and
   a layer over the two-dimensional material, the layer comprising a metal-infiltrated or ceramic material-infiltrated organic sacrificial material, wherein at least a portion of the organic sacrificial material is irreversibly physically adsorbed to the two-dimensional material.

* * * * *